(12) United States Patent
Chien

(10) Patent No.: US 10,505,532 B1
(45) Date of Patent: Dec. 10, 2019

(54) OUTPUT BUFFER AND OPERATION METHOD THEREOF

(71) Applicant: HIMAX TECHNOLOGIES LIMITED, Tainan (TW)

(72) Inventor: Chia-Chu Chien, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/275,304

(22) Filed: Feb. 13, 2019

(51) Int. Cl.
*H03B 1/00* (2006.01)
*H03K 17/16* (2006.01)
(52) U.S. Cl.
CPC .................................. *H03K 17/162* (2013.01)
(58) Field of Classification Search
CPC ... G11C 29/028; G11C 29/022; G11C 7/1057; H03K 19/0005
See application file for complete search history.

(56) References Cited

U.S. PATENT DOCUMENTS 6,031,389 A * 2/2000 Fotouhi ............ H03K 19/00361
326/31

* cited by examiner

*Primary Examiner* — Sibin Chen
(74) *Attorney, Agent, or Firm* — JCIPRNET

(57) ABSTRACT

An output buffer and an operation method thereof are provided. The output buffer includes an input stage circuit, an output stage circuit, a rising control circuit, and a falling control circuit. The input stage circuit correspondingly generates a first gate control voltage and a second gate control voltage according to an input voltage of the output buffer. The output stage circuit correspondingly generates an output voltage of the output buffer according to the first gate control voltage and a second gate control voltage. When the output voltage is to be pulled up, the rising control circuit pulls down the first gate control voltage and the second gate control voltage during a first transient period. When the output voltage is to be pulled down, the falling control circuit pulls up the first gate control voltage and the second gate control voltage during a second transient period.

15 Claims, 6 Drawing Sheets

OUTPUT BUFFER AND OPERATION METHOD THEREOF

BACKGROUND OF THE INVENTION

Field of the Invention

The invention relates to an electronic circuit, and particularly relates to an output buffer and an operation method thereof.

Description of Related Art

Generally, a source driver is configured with an output buffer. In the source driver, the output buffer may gain an analog voltage of a digital-analog converter (DAC) for outputting to a data line (or referred to as a source line) of a display panel. As a resolution and/or a frame rate of the display panel becomes higher, a charging time for one scan line becomes shorter. In order to drive (charge or discharge) one pixel within a short time, the output buffer requires to have a high enough driving capability. Namely, the output buffer has to have a high enough slew rate. In order to enhance the slew rate, a tail current of the conventional output buffer is increased. The increase of the tail current means increase of power consumption.

SUMMARY OF THE INVENTION

The invention is directed to an output buffer and an operation method thereof, which are adapted to enhance a slew rate of an output voltage.

An embodiment of the invention provides an output buffer. The output buffer includes an input stage circuit, an output stage circuit, a rising control circuit, and a falling control circuit. The input stage circuit is configured to receive an input voltage of the output buffer. The input stage circuit correspondingly generates a first gate control voltage and a second gate control voltage according to the input voltage. The output stage circuit is coupled to the input stage circuit to receive the first gate control voltage and the second gate control voltage. The output stage circuit is configured to correspondingly generate an output voltage of the output buffer according to the first gate control voltage and the second gate control voltage. The rising control circuit is configured to compare the input voltage and the output voltage to obtain a first comparison result. When the first comparison result indicates that the output voltage is to be pulled up, the rising control circuit pulls down the first gate control voltage and the second gate control voltage during a first transient period. The falling control circuit is configured to compare the input voltage and the output voltage to obtain a second comparison result. When the second comparison result indicates that the output voltage is to be pulled down, the falling control circuit pulls up the first gate control voltage and the second gate control voltage during a second transient period.

An embodiment of the invention provides an operation method of an output buffer. The operation method includes: correspondingly generating a first gate control voltage and a second gate control voltage by an input stage circuit according to an input voltage of the output buffer; correspondingly generating an output voltage of the output buffer by an output stage circuit according to the first gate control voltage and the second gate control voltage; comparing the input voltage and the output voltage by a rising control circuit to obtain a first comparison result; pulling down the first gate control voltage and the second gate control voltage by the rising control circuit during a first transient period when the first comparison result indicates that the output voltage is to be pulled up; comparing the input voltage and the output voltage by a falling control circuit to obtain a second comparison result; pulling up the first gate control voltage and the second gate control voltage by the falling control circuit during a second transient period when the second comparison result indicates that the output voltage is to be pulled down.

According to the above description, the output buffer and the operating method of the embodiments of the invention are adapted to compare the input voltage and the output voltage. When the output voltage is to be pulled up, the first gate control voltage and the second gate control voltage of the output stage circuit of the output buffer are all pulled down, so as to enhance a slew rate of the output voltage. When the output voltage is to be pulled down, the first gate control voltage and the second gate control voltage of the output stage circuit of the output buffer are all pulled up, so as to enhance the slew rate of the output voltage.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
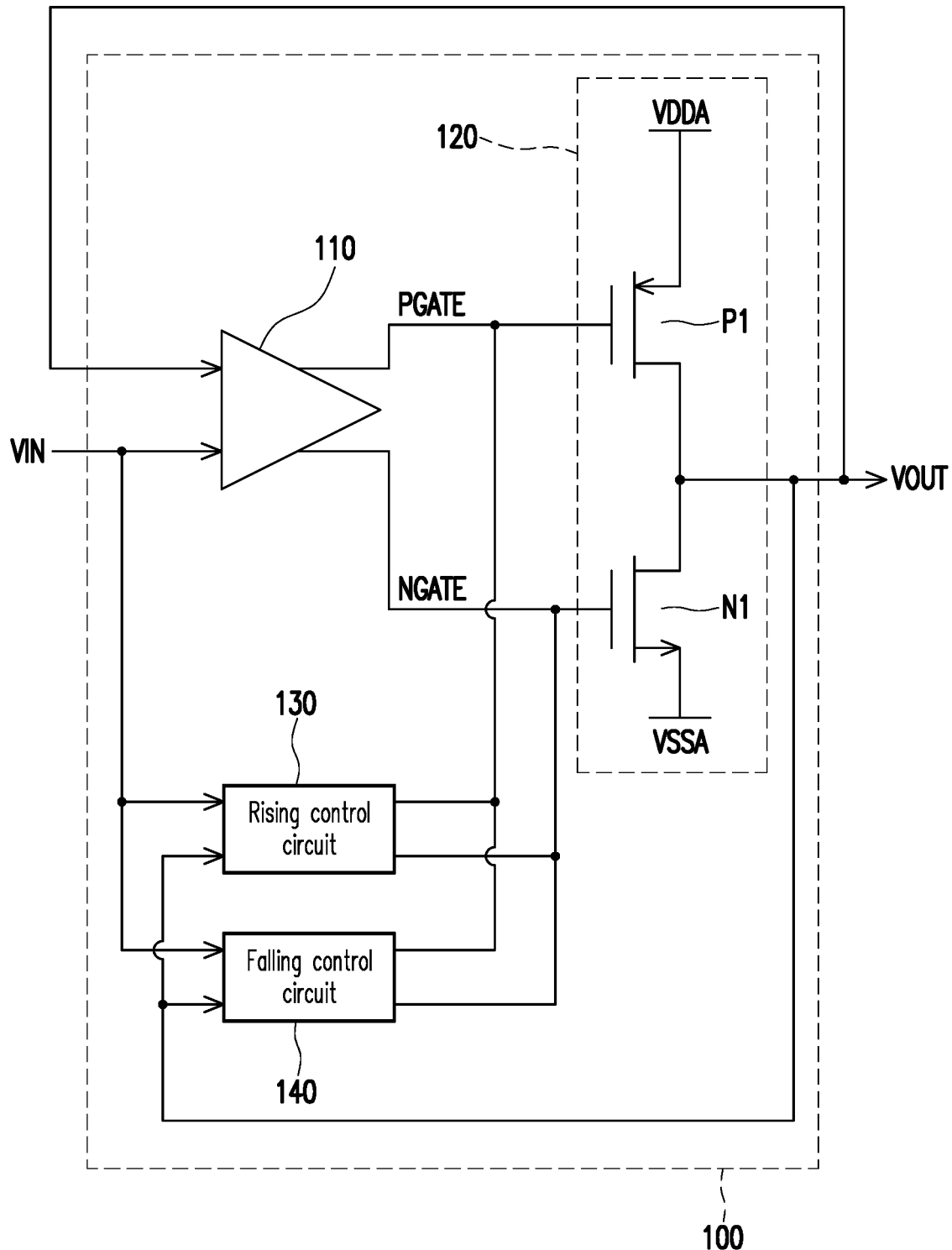
FIG. 1 is a circuit block schematic diagram of an output buffer according to an embodiment of the invention.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a circuit block schematic diagram of an output buffer 100 according to an embodiment of the invention. A first input terminal of the output buffer 100 receives an input voltage VIN from a previous-stage circuit (not shown), and an output terminal of the output buffer 100 outputs an output voltage VOUT to a post-stage circuit (not shown). In the embodiment of FIG. 1, the output voltage VOUT of the output buffer 100 is fed back to a second input terminal of the output buffer 100. According to a design requirement, in other embodiments, the output terminal of the output buffer 100 may be coupled to the second input terminal of the output buffer 100 through other device/circuit (not shown).

In the embodiment of FIG. 1, the output buffer 100 includes an input stage circuit 110, an output stage circuit 120, a rising control circuit 130, and a falling control circuit 140. According to the design requirement, the input stage circuit 110 may include a differential input pair, a gain circuit and/or other input stage circuit. For example, the input stage circuit 110 may be an input stage circuit of a conventional operational amplifier or an input stage circuit and/or a gain stage circuit of other amplifier. A first input terminal of the input stage circuit 110 is coupled to the first input terminal of the output buffer 100 to receive the input voltage VIN. A second input terminal of the input stage circuit 110 is coupled to the second input terminal of the output buffer 100 to receive the output voltage VOUT. The input stage circuit 110 may correspondingly generate a gate control voltage PGATE and a gate control voltage NGATE according to the input voltage VIN.

A first input terminal of the output stage circuit 120 is coupled to a first output terminal of the input stage circuit 110 to receive the gate control voltage PGATE. A second input terminal of the output stage circuit 120 is coupled to a second output terminal of the input stage circuit 110 to receive the gate control voltage NGATE. An output terminal of the output stage circuit 120 is coupled to the output terminal of the output buffer 100. The output stage circuit 120 may correspondingly generate the output voltage VOUT of the output buffer 100 according to the gate control voltage PGATE and the gate control voltage NGATE.

In the embodiment of FIG. 1, the output stage circuit 120 includes a transistor P1 and a transistor N1. A control terminal (for example, a gate) of the transistor P1 is coupled to the first output terminal of the input stage circuit 110 to receive the gate control voltage PGATE. A first terminal (for example a source) of the transistor P1 is coupled to a system voltage VDDA. A level of the system voltage VDDA may be determined according to an actual design requirement. A second terminal (for example, a drain) of the transistor P1 is coupled to the output terminal of the output stage circuit 120, where the output terminal of the output stage circuit 120 outputs the output voltage VOUT. A control terminal (for example, a gate) of the transistor N1 is coupled to the second output terminal of the input stage circuit 110 to receive the gate control circuit NGATE. A first terminal (for example a source) of the transistor N1 is coupled to a reference voltage VSSA. A level of the reference voltage VSSA may be determined according to an actual design requirement. A second terminal (for example, a drain) of the transistor N1 is coupled to the output terminal of the output stage circuit 120 and the second terminal of the transistor P1.

The output stage circuit 120 shown in FIG. 1 is an example, and implementation of the output stage circuit 120 is not limited by the embodiment shown in FIG. 1. According to the design requirement, the output stage circuit 120 may include any type of output circuit. For example, in other embodiments, the output stage circuit 120 may be an output stage circuit of the conventional operational amplifier or an output stage circuit of other amplifier.

Figure 2:
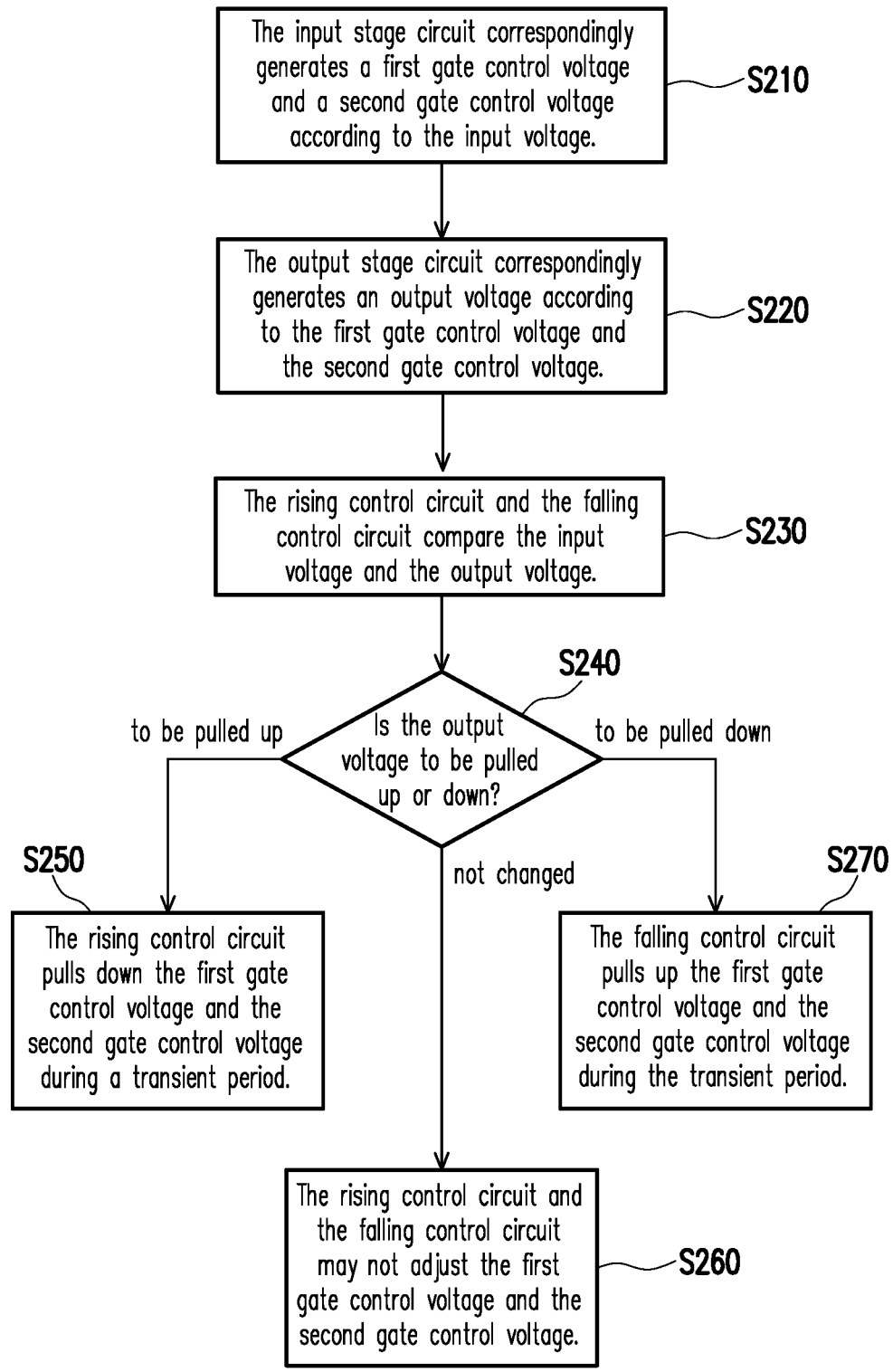
FIG. 2 is a flowchart illustrating an operation method of an output buffer according to an embodiment of the invention.

FIG. 2 is a flowchart illustrating an operation method of an output buffer according to an embodiment of the invention. Referring to FIG. 1 and FIG. 2, in step S210, the input stage circuit 110 correspondingly generates the gate control voltage PGATE and the gate control voltage NGATE according to the input voltage VIN of the output buffer 100. In step S220, the output stage circuit 120 correspondingly generates the output voltage VOUT of the output buffer 100 according to the gate control voltage PGATE and the gate control voltage NGATE. In step S230, the rising control circuit 130 compare the input voltage VIN and the output voltage VOUT to obtain a first comparison result, and the falling control circuit 140 compares the input voltage VIN and the output voltage VOUT to obtain a second comparison result.

When the first comparison result indicates that the output voltage VOUT is to be pulled up ("to be pulled up" in step S240), the rising control circuit 130 pulls down the gate control voltage PGATE and the gate control voltage NGATE during a transient period (step S250). When the rising control circuit 130 pulls down the gate control voltage NGATE, a turn-off state of the transistor N1 may be ensured, so as to avoid producing a short-circuit current. When the rising control circuit 130 pulls down the gate control voltage PGATE, a current flowing through the transistor P1 may be temporarily increased, so as to pull up the output voltage VOUT in acceleration. Therefore, a slew rate of the output voltage VOUT may be enhanced.

According to the design requirement, in some embodiments, the step S250 may include following operations. When the input voltage VIN is greater than the output voltage VOUT, the rising control circuit 130 may pull down the gate control voltage PGATE and the gate control voltage NGATE. When the input voltage VIN is smaller than or equal to the output voltage VOUT, the rising control circuit 130 may not adjust the gate control voltage PGATE and the gate control voltage NGATE.

When the first comparison result and the second comparison result all indicate that the output voltage is to be not changed ("not changed" in the step S240), the rising control circuit 130 and the falling control circuit 140 may not adjust the gate control voltage PGATE and the gate control voltage NGATE (step S260). In case that the rising control circuit 130 and the falling control circuit 140 do not interfere the gate control voltage PGATE and the gate control voltage NGATE, a level of the gate control voltage PGATE and a level of the gate control voltage NGATE are determined by the input stage circuit 110.

When the second comparison result indicates that the output voltage VOUT is to be pulled down ("to be pulled down" in the step S240), the falling control circuit 140 pulls up the gate control voltage PGATE and the gate control voltage NGATE during the transient period (step S270). When the falling control circuit 140 pulls up the gate control voltage PGATE, the turn-off state of the transistor P1 may be ensured, so as to avoid producing the short-circuit current. When the falling control circuit 140 pulls up the gate control voltage NGATE, a current flowing through the transistor N1 may be temporarily increased, so as to pull down the output voltage VOUT in acceleration. Therefore, the slew rate of the output voltage VOUT may be enhanced.

According to the design requirement, in some embodiments, the step S270 may include following operations. When the input voltage VIN is smaller than the output voltage VOUT, the falling control circuit 140 may pull up the gate control voltage PGATE and the gate control voltage NGATE. When the input voltage VIN is greater than or equal to the output voltage VOUT, the falling control circuit 140 may not adjust the gate control voltage PGATE and the gate control voltage NGATE.

According to different design requirement, the block of the rising control circuit 130 and/or the falling control circuit 140 may be implemented by hardware, firmware, software (i.e. programs) or a combination thereof. Regarding the hardware implementation, the block of the rising control circuit 130 and/or the falling control circuit 140 may be implemented by a logic circuit on an integration circuit. Related functions of the rising control circuit 130 and/or the falling control circuit 140 may be implemented as hardware by using hardware description languages, for example, Verilog HDL or VHDL) or other suitable program languages. For example, related functions of the rising control circuit 130 and/or the falling control circuit 140 may be implemented by one or a plurality of controllers, micro controllers, micro processors, Application-Specific Integrated Circuits (ASICs) Digital Signal Processors (DSPs), Field Programmable Gate Array (FPGA) and/or various logic blocks, modules and circuits in other processing unit.

Figure 3:
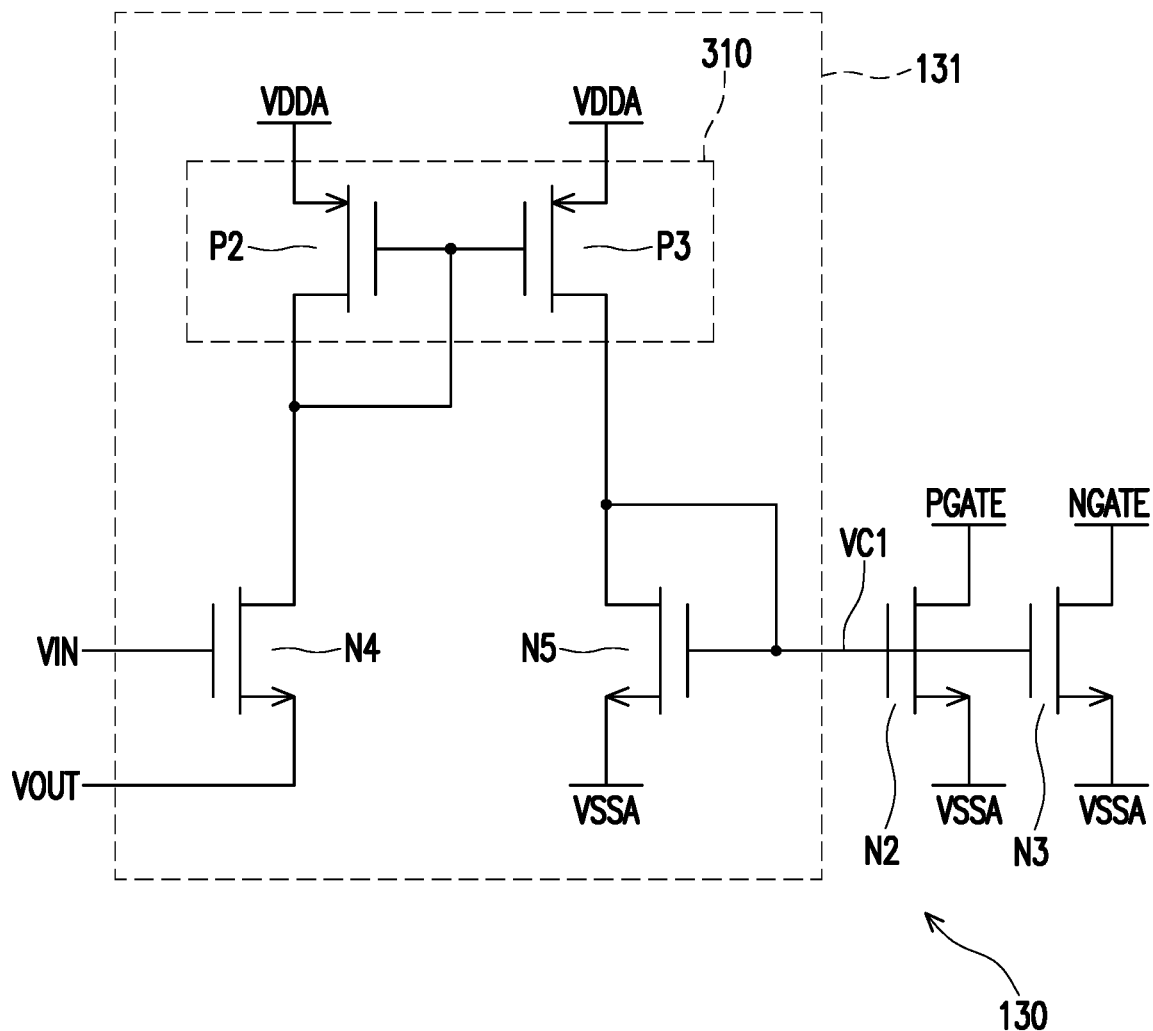
FIG. 3 is a circuit block schematic diagram of a rising control circuit of FIG. 1 according to an embodiment of the invention.

FIG. 3 is a circuit block schematic diagram of the rising control circuit 130 of FIG. 1 according to an embodiment of the invention. In the embodiment of FIG. 3, the rising control circuit 130 includes a comparison circuit 131, a transistor N2 and a transistor N3. The comparison circuit 131 may compare the input voltage VIN and the output voltage VOUT to generate a control voltage VC1 to serve as the first comparison result. A control terminal (for example, a gate) of the transistor N2 is coupled to an output terminal of the comparison circuit 131 to receive the control voltage VC1. A first terminal (for example, a source) of the transistor N2 is coupled to the reference voltage VSSA. A second terminal (for example, a drain) of the transistor N2 is coupled to the first input terminal of the output stage circuit 120 to receive the gate control voltage PGATE. A control terminal (for example, a gate) of the transistor N3 is coupled to the output terminal of the comparison circuit 131 to receive the control voltage VC1. A first terminal (for example, a source) of the transistor N3 is coupled to the reference voltage VSSA. A second terminal (for example, a drain) of the transistor N3 is coupled to the second input terminal of the output stage circuit 120 to receive the gate control voltage NGATE.

When the input voltage VIN is greater than the output voltage VOUT, the comparison circuit 131 may turn on the transistor N2 and the transistor N3 through the control voltage VC1, so as to pull down the gate control voltage PGATE and the gate control voltage NGATE. When the input voltage VIN is smaller than or equal to the output voltage VOUT, the comparison circuit 131 may turn off the transistor N2 and the transistor N3 through the control voltage VC1, so that the rising control circuit 130 may not interfere (not adjust) the gate control voltage PGATE and the gate control voltage NGATE.

In the embodiment of FIG. 3, the comparison circuit 131 includes a transistor N4, a transistor N5 and a current mirror 310. A control terminal (for example, a gate) of the transistor N4 is coupled to the input voltage VIN. A first terminal (for example, a source) of the transistor N4 is coupled to the output voltage VOUT. A master current terminal of the current mirror 310 is coupled to a second terminal (for example, a drain) of the transistor N4. A slave current terminal of the current mirror 310 is coupled to the output terminal of the comparison circuit 131, where the output terminal of the comparison circuit 131 may provide the control voltage VC1 to the transistor N2 and the transistor N3. A control terminal (for example, a gate) of the transistor N5 is coupled to the output terminal of the comparison circuit 131. A first terminal (for example, a source) of the transistor N5 is coupled to the reference voltage VSSA. A second terminal (for example, a drain) of the transistor N5 is coupled to the slave current terminal of the current mirror 310 and the control terminal of the transistor N5.

In the embodiment of FIG. 3, the current mirror 310 includes a transistor P2 and a transistor P3. A first terminal (for example, a source) of the transistor P2 is coupled to the system voltage VDDA. A second terminal (for example, a drain) and a control terminal (for example, a gate) of the transistor P2 are coupled to the master current terminal of the current mirror 310. A first terminal (for example, a source) of the transistor P3 is coupled to the system voltage VDDA. A second terminal (for example, a drain) of the transistor P3 is coupled to the slave current terminal of the current mirror 310. A control terminal (for example, a gate) of the transistor P3 is coupled to the control terminal of the transistor P2.

Figure 4:
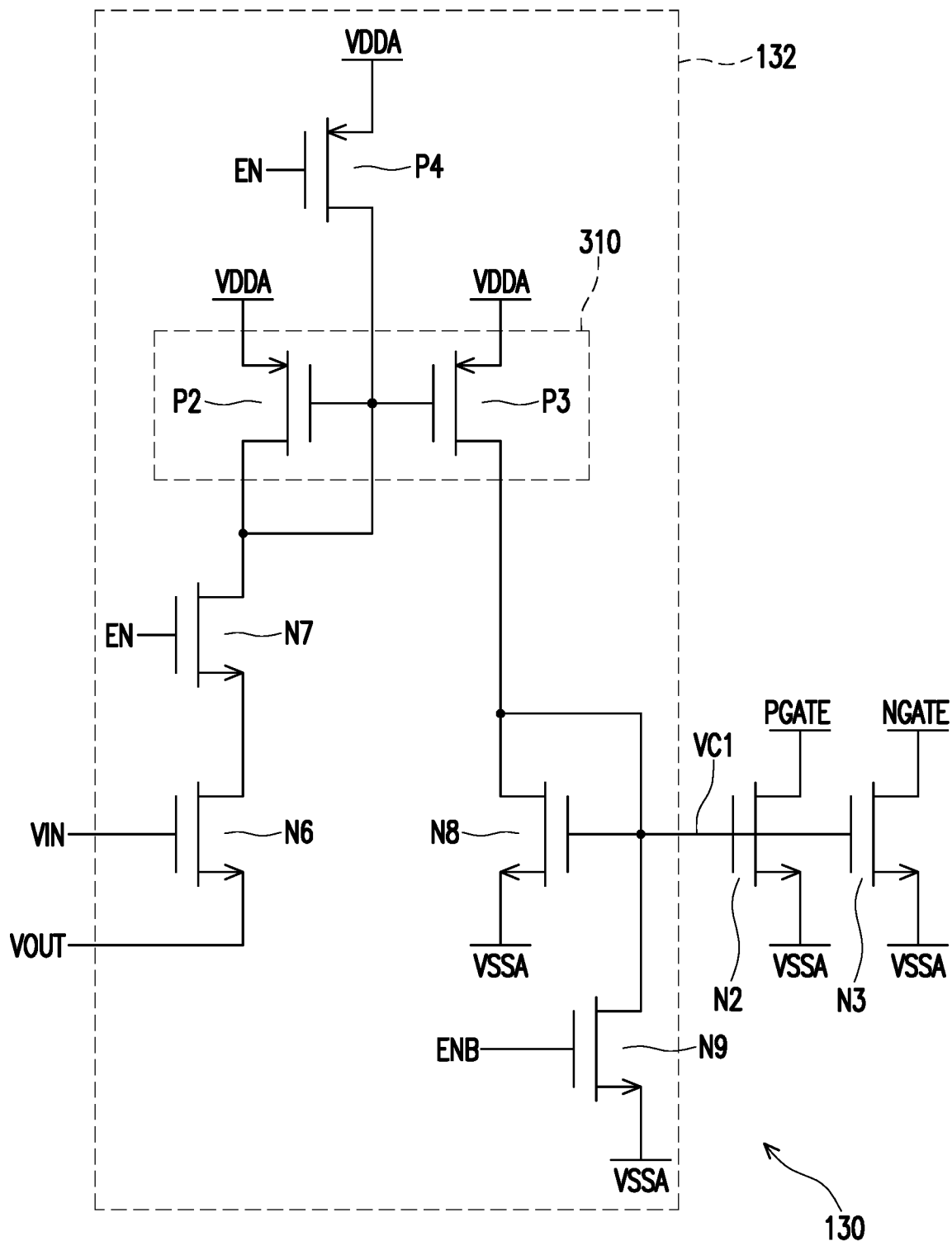
FIG. 4 is a circuit block schematic diagram of the rising control circuit of FIG. 1 according to another embodiment of the invention.

FIG. 4 is a circuit block schematic diagram of the rising control circuit 130 of FIG. 1 according to another embodiment of the invention. In the embodiment of FIG. 4, the rising control circuit 130 includes a comparison circuit 132, a transistor N2 and a transistor N3. Description of the comparison circuit 132, the transistor N2 and the transistor N3 of FIG. 4 may be deduced according to related description of the comparison circuit 131, the transistor N2 and the transistor N3 of FIG. 3, and details thereof are not repeated.

In the embodiment of FIG. 4, the comparison circuit 132 includes a transistor N6, a transistor N7, a transistor N8, a transistor N9, a transistor P4 and the current mirror 310. A control terminal (for example, a gate) of the transistor N6 is coupled to the input voltage VIN. A first terminal (for example, a source) of the transistor N6 is coupled to the output voltage VOUT. A control terminal (for example, a gate) of the transistor N7 is controlled by a control signal EN. A first terminal (for example, a source) of the transistor N7 is coupled to a second terminal (for example, a drain) of the transistor N6.

A master current terminal of the current mirror 310 is coupled to a second terminal (for example, a drain) of the transistor N7. A slave current terminal of the current mirror 310 is coupled to the output terminal of the comparison circuit 132, where the output terminal of the comparison circuit 132 may provide the control voltage VC1 to the transistor N2 and the transistor N3. The current mirror 310 shown in FIG. 4 may be deduced with reference of related description of the current mirror 310 of FIG. 3, and detail thereof is not repeated.

A control terminal (for example, a gate) of the transistor P4 is controlled by the control signal EN. A first terminal (for example, a source) of the transistor P4 is coupled to the system voltage VDDA. A second terminal (for example, a drain) of the transistor P4 is coupled to an enable terminal of the current mirror 310. Namely, the second terminal of the transistor P4 is coupled to the control terminal of the transistor P2 and the control terminal of the transistor P3. A control terminal (for example, a gate) of the transistor N8 is coupled to the output terminal of the comparison circuit 132. A first terminal (for example, a source) of the transistor N8 is coupled to the reference voltage VSSA. A second terminal (for example, a drain) of the transistor N8 is coupled to the slave current terminal of the current mirror 310 and the control terminal of the transistor N8. A control terminal (for example, a gate) of the transistor N9 is controlled by a control signal ENB, where the control signal ENB is an inverted signal of the control signal EN. A first terminal (for example, a source) of the transistor N9 is coupled to the reference voltage VSSA. A second terminal (for example, a drain) of the transistor N9 is coupled to the control terminal of the transistor N8.

When the control signal EN has a high voltage level (for example, a level of the system voltage VDDA or other level), i.e. when the control signal ENB has a low voltage level (for example, a level of the reference voltage VSSA or other level), the transistor N7 is turned on, and the transistor P4 and the transistor N9 are turned off, and now the operation of the comparison circuit 132 of FIG. 4 is similar to the operation of the comparison circuit 131 of FIG. 3. When the control signal EN has the low voltage level (i.e. the control signal ENB has the high voltage level), the transistor N7 is turned off, and the transistor P4 and the transistor N9 are turned on, and now the comparison circuit 132 of FIG. 4 is disabled, and the control voltage VC1 is pulled down to the low voltage level. When the control voltage VC1 is pulled down to the low voltage level, the transistor N2 and the transistor N3 are turned off. Therefore, when the control signal EN (the control signal ENB) disables the rising control circuit 130, the rising control circuit 130 may not interfere (not adjust) the gate control voltage PGATE and the gate control voltage NGATE.

In some application situations, after the output voltage VOUT is pulled down, the output voltage VOUT may be probably lower (smaller than) the input voltage VIN during the specific period, and after the specific period is ended, the level of the output voltage VOUT is returned to the level of the input voltage VIN. Generally, the specific period is very short. Through control of the control signal EN (the control signal ENB), the rising control circuit 130 may be disabled within the specific period, and enabled outside the specific period. Therefore, the wrong operation of the rising control circuit 130 during the specific period may be avoided.

Figure 5:
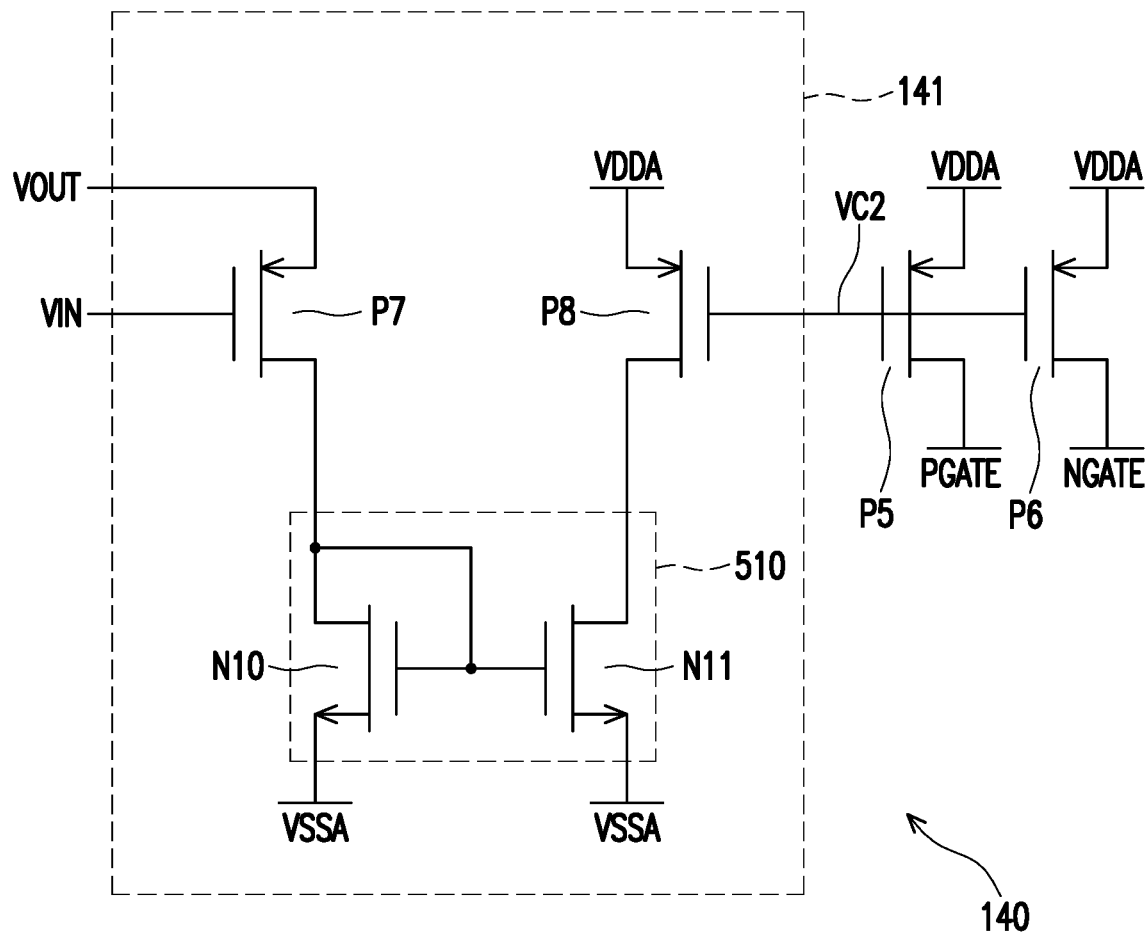
FIG. 5 is a circuit block schematic diagram of a falling control circuit of FIG. 1 according to an embodiment of the invention.

FIG. 5 is a circuit block schematic diagram of a falling control circuit 140 of FIG. 1 according to an embodiment of the invention. In the embodiment of FIG. 5, the falling control circuit 140 includes a comparison circuit 141, a transistor P5 and a transistor P6. The comparison circuit 141 may compare the input voltage VIN and the output voltage VOUT to generate a control voltage VC2 to serve as the second comparison result. A control terminal (for example, a gate) of the transistor P5 is coupled to an output terminal of the comparison circuit 141 to receive the control voltage VC2. A first terminal (for example, a source) of the transistor P5 is coupled to the system voltage VDDA. A second terminal (for example, a drain) of the transistor P5 is coupled to the first input terminal of the output stage circuit 120 to receive the gate control voltage PGATE. A control terminal (for example, a gate) of the transistor P6 is coupled to the output terminal of the comparison circuit 141 to receive the control voltage VC2. A first terminal (for example, a source) of the transistor P6 is coupled to the system voltage VDDA. A second terminal (for example, a drain) of the transistor P6 is coupled to the second input terminal of the output stage circuit 120 to receive the gate control voltage NGATE.

When the input voltage VIN is smaller than the output voltage VOUT, the comparison circuit 141 may turn on the transistor P5 and the transistor P6 through the control voltage VC2, so as to pull up the gate control voltage PGATE and the gate control voltage NGATE. When the input voltage VIN is greater than or equal to the output voltage VOUT, the comparison circuit 141 may turn off the transistor P5 and the transistor P6 through the control voltage VC2, so that the falling control circuit 140 may not interfere (not adjust) the gate control voltage PGATE and the gate control voltage NGATE.

In the embodiment of FIG. 5, the comparison circuit 141 includes a transistor P7, a transistor P8 and a current mirror 510. A control terminal (for example, a gate) of the transistor P7 is coupled to the input voltage VIN. A first terminal (for example, a gate) of the transistor P7 is coupled to the output voltage VOUT. A master current terminal of the current mirror 510 is coupled to a second terminal (for example, a drain) of the transistor P7. A slave current terminal of the current mirror 510 is coupled to the output terminal of the comparison circuit 141, where the output terminal of the comparison circuit 141 may provide the control voltage VC2 to the transistor P5 and the transistor P6. A control terminal (for example, a gate) of the transistor P8 is coupled to the output terminal of the comparison circuit 141. A first terminal (for example, a source) of the transistor P8 is coupled to the system voltage VDDA. A second terminal (for example, a drain) of the transistor P8 is coupled to the slave current terminal of the current mirror 510 and the control terminal of the transistor P8.

In the embodiment of FIG. 5, the current mirror 510 includes a transistor N10 and a transistor N11. A first terminal (for example, a source) of the transistor N10 is coupled to the reference voltage VSSA. A second terminal (for example, a drain) and a control terminal (for example, a gate) of the transistor N10 are coupled to the master current terminal of the current mirror 510. A first terminal (for example, a source) of the transistor N11 is coupled to the reference voltage VSSA. A second terminal (for example, a drain) of the transistor N11 is coupled to the slave current terminal of the current mirror 510. A control terminal (for example, a gate) of the transistor N11 is coupled to the control terminal of the transistor N10.

Figure 6:
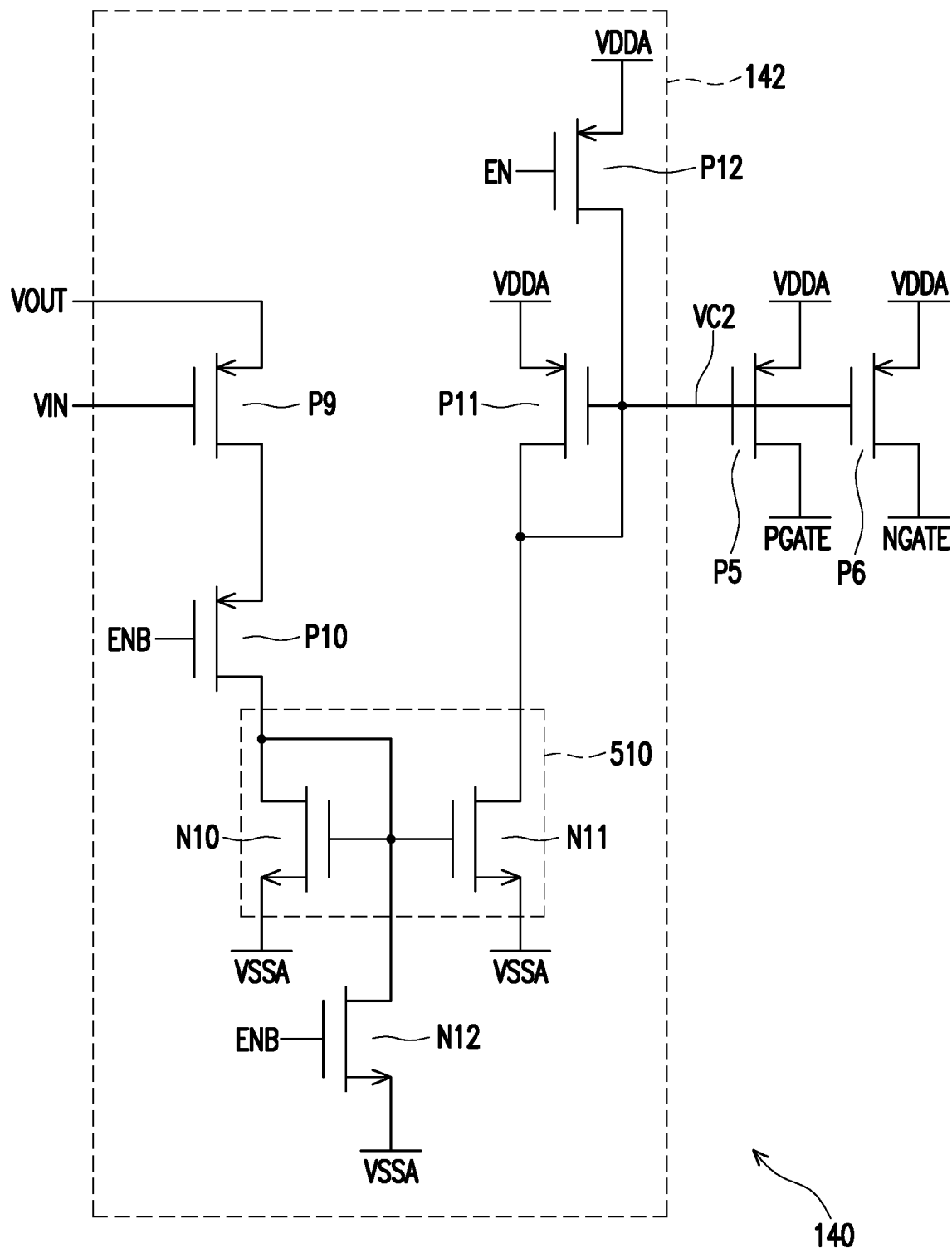
FIG. 6 is a circuit block schematic diagram of the falling control circuit of FIG. 1 according to another embodiment of the invention.

FIG. 6 is a circuit block schematic diagram of the falling control circuit 140 of FIG. 1 according to another embodiment of the invention. In the embodiment of FIG. 6, the falling control circuit 140 includes a comparison circuit 142, a transistor P5 and a transistor P6. Description of the comparison circuit 142, the transistor P5 and the transistor P6 of FIG. 6 may be deduced according to related description of the comparison circuit 141, the transistor P5 and the transistor P6 of FIG. 5, and details thereof are not repeated.

In the embodiment of FIG. 6, the comparison circuit 142 includes a transistor P9, a transistor P10, a transistor P11, a transistor P12, a transistor N12 and the current mirror 510. A control terminal (for example, a gate) of the transistor P9 is coupled to the input voltage VIN. A first terminal (for example, a source) of the transistor P9 is coupled to the output voltage VOUT. A control terminal (for example, a gate) of the transistor P10 is controlled by the control signal ENB. A first terminal (for example, a source) of the transistor P10 is coupled to a second terminal (for example, a drain) of the transistor P9.

A master current terminal of the current mirror 510 is coupled to a second terminal (for example, a drain) of the transistor P10. A slave current terminal of the current mirror 510 is coupled to the output terminal of the comparison circuit 142, where the output terminal of the comparison circuit 142 may provide the control voltage VC2 to the transistor P5 and the transistor P6. The current mirror 510 shown in FIG. 6 may be deduced with reference of related description of the current mirror 510 of FIG. 5, and detail thereof is not repeated.

A control terminal (for example, a gate) of the transistor N12 is controlled by the control signal ENB. A first terminal (for example, a source) of the transistor N12 is coupled to the reference voltage VSSA. A second terminal (for example, a drain) of the transistor N12 is coupled to an enable terminal of the current mirror 510. Namely, the second terminal of the transistor N12 is coupled to the control terminal of the transistor N10 and the control terminal of the transistor N11. A control terminal (for example, a gate) of the transistor P11 is coupled to the output terminal of the comparison circuit 142. A first terminal (for example, a source) of the transistor P11 is coupled to the system voltage VDDA. A second terminal (for example, a drain) of the transistor P11 is coupled to the slave current terminal of the current mirror 510 and the control terminal of the transistor P11. A control terminal (for example, a gate) of the transistor P12 is controlled by the control signal EN, where the control signal EN is an inverted signal of the control signal ENB. A first terminal (for example, a source) of the transistor P12 is coupled to the system voltage VDDA. A second terminal (for example, a drain) of the transistor P12 is coupled to the control terminal of the transistor P11.

When the control signal EN has the high voltage level (for example, the level of the system voltage VDDA or other level), i.e. when the control signal ENB has the low voltage level (for example, the level of the reference voltage VSSA or other level), the transistor P10 is turned on, and the transistor N12 and the transistor P12 are turned off, and now the operation of the comparison circuit 142 of FIG. 6 is similar to the operation of the comparison circuit 141 of FIG. 5. When the control signal EN has the low voltage level (i.e. the control signal ENB has the high voltage level), the transistor P10 is turned off, and the transistor N12 and the transistor P12 are turned on, and now the comparison circuit 142 of FIG. 6 is disabled, and the control voltage VC2 is pulled up to the high voltage level. When the control voltage VC2 is pulled up to the high voltage level, the transistor P5 and the transistor P6 are turned off. Therefore, when the control signal EN (the control signal ENB) disables the falling control circuit 140, the falling control circuit 140 may not interfere (not adjust) the gate control voltage PGATE and the gate control voltage NGATE.

In some application situations, after the output voltage VOUT is pulled up, the output voltage VOUT may probably exceed (be greater than) the input voltage VIN during a specific period, and after the specific period is ended, the level of the output voltage VOUT is returned to the level of the input voltage VIN. Generally, the specific period is very short. Through control of the control signal EN (the control signal ENB), the falling control circuit 140 may be disabled within the specific period, and enabled outside the specific period. Therefore, the wrong operation of the falling control circuit 140 during the specific period may be avoided.

In summary, the output buffer and the operating method of the embodiments of the invention are adapted to compare the input voltage VIN and the output voltage VOUT. When the output voltage VOUT is to be pulled up, the gate control voltage PGATE and the gate control voltage NGATE of the output stage circuit 120 of the output buffer 100 are all pulled down, so as to enhance a slew rate of the output voltage VOUT. When the output voltage VOUT is to be pulled down, the gate control voltage PGATE and the gate control voltage NGATE of the output stage circuit 120 of the output buffer 100 are all pulled up, so as to enhance the slew rate of the output voltage VOUT.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An output buffer, comprising:
an input stage circuit, configured to receive an input voltage of the output buffer, and correspondingly generating a first gate control voltage and a second gate control voltage according to the input voltage;
an output stage circuit, coupled to the input stage circuit to receive the first gate control voltage and the second gate control voltage, and configured to correspondingly generate an output voltage of the output buffer according to the first gate control voltage and the second gate control voltage;
a rising control circuit, configured to compare the input voltage and the output voltage to obtain a first comparison result, wherein when the first comparison result indicates that the output voltage is to be pulled up, the rising control circuit pulls down the first gate control voltage and the second gate control voltage during a first transient period; and
a falling control circuit, configured to compare the input voltage and the output voltage to obtain a second comparison result, wherein when the second comparison result indicates that the output voltage is to be pulled down, the falling control circuit pulls up the first gate control voltage and the second gate control voltage during a second transient period.

2. The output buffer as claimed in claim 1, wherein the output stage circuit comprises:
a first transistor, having a control terminal coupled to the input stage circuit to receive the first gate control voltage, wherein a first terminal of the first transistor is coupled to a system voltage, a second terminal of the first transistor is coupled to an output terminal of the output stage circuit, and the output terminal of the output stage circuit outputs the output voltage of the output buffer; and
a second transistor, having a control terminal coupled to the input stage circuit to receive the second gate control voltage, wherein a first terminal of the second transistor is coupled to a reference voltage, and a second terminal of the second transistor is coupled to the output terminal of the output stage circuit.

3. The output buffer as claimed in claim 1, wherein
the rising control circuit pulls down the first gate control voltage and the second gate control voltage when the input voltage is greater than the output voltage, and
the rising control circuit does not adjust the first gate control voltage and the second gate control voltage when the input voltage is smaller than or equal to the output voltage.

4. The output buffer as claimed in claim 1, wherein the rising control circuit comprises:
a comparison circuit, configured to compare the input voltage and the output voltage to generate a control voltage to serve as the first comparison result;
a first transistor, having a control terminal coupled to an output terminal of the comparison circuit to receive the control voltage, wherein a first terminal of the first transistor is coupled to a reference voltage, and a second terminal of the first transistor is coupled to a first input terminal of the output stage circuit to receive the first gate control voltage; and a second transistor, having a control terminal coupled to the output terminal of the comparison circuit to receive the control voltage, wherein a first terminal of the second transistor is coupled to the reference voltage, and a second terminal of the second transistor is coupled to a second input terminal of the output stage circuit to receive the second gate control voltage.

5. The output buffer as claimed in claim 4, wherein the comparison circuit comprises:
a third transistor, having a control terminal coupled to the input voltage, wherein a first terminal of the third transistor is coupled to the output voltage;
a current mirror, having a master current terminal coupled to a second terminal of the third transistor, wherein a slave current terminal of the current mirror is coupled to the output terminal of the comparison circuit; and
a fourth transistor, having a control terminal coupled to the output terminal of the comparison circuit, wherein a first terminal of the fourth transistor is coupled to the reference voltage, and a second terminal of the fourth transistor is coupled to the slave current terminal of the current mirror.

6. The output buffer as claimed in claim 4, wherein the comparison circuit comprises:
a third transistor, having a control terminal coupled to the input voltage, wherein a first terminal of the third transistor is coupled to the output voltage;
a fourth transistor, having a control terminal controlled by a first control signal, wherein a first terminal of the fourth transistor is coupled to a second terminal of the third transistor;
a current mirror, having a master current terminal coupled to a second terminal of the fourth transistor, wherein a slave current terminal of the current mirror is coupled to the output terminal of the comparison circuit;
a fifth transistor, having a control terminal controlled by the first control signal, wherein a first terminal of the fifth transistor is coupled to a system voltage, and a second terminal of the fifth transistor is coupled to an enable terminal of the current mirror; and
a sixth transistor, having a control terminal coupled to the output terminal of the comparison circuit, wherein a first terminal of the sixth transistor is coupled to the reference voltage, and a second terminal of the sixth transistor is coupled to the slave current terminal of the current mirror.

7. The output buffer as claimed in claim 6, wherein the comparison circuit further comprises:
a seventh transistor, having a control terminal controlled by a second control signal, wherein a first terminal of the seventh transistor is coupled to the reference voltage, and a second terminal of the seventh transistor is coupled to the control terminal of the sixth transistor.

8. The output buffer as claimed in claim 1, wherein
the falling control circuit pulls up the first gate control voltage and the second gate control voltage when the input voltage is smaller than the output voltage, and
the falling control circuit does not adjust the first gate control voltage and the second gate control voltage when the input voltage is greater than or equal to the output voltage.

9. The output buffer as claimed in claim 1, wherein the falling control circuit comprises:
a comparison circuit, configured to compare the input voltage and the output voltage to generate a control voltage to serve as the second comparison result;

a first transistor, having a control terminal coupled to an output terminal of the comparison circuit to receive the control voltage, wherein a first terminal of the first transistor is coupled to a system voltage, and a second terminal of the first transistor is coupled to a first input terminal of the output stage circuit to receive the first gate control voltage; and
a second transistor, having a control terminal coupled to the output terminal of the comparison circuit to receive the control voltage, wherein a first terminal of the second transistor is coupled to the system voltage, and a second terminal of the second transistor is coupled to a second input terminal of the output stage circuit to receive the second gate control voltage.

10. The output buffer as claimed in claim 9, wherein the comparison circuit comprises:
a third transistor, having a control terminal coupled to the input voltage, wherein a first terminal of the third transistor is coupled to the output voltage;
a current mirror, having a master current terminal coupled to a second terminal of the third transistor, wherein a slave current terminal of the current mirror is coupled to the output terminal of the comparison circuit; and
a fourth transistor, having a control terminal coupled to the output terminal of the comparison circuit, wherein a first terminal of the fourth transistor is coupled to the system voltage, and a second terminal of the fourth transistor is coupled to the slave current terminal of the current mirror.

11. The output buffer as claimed in claim 9, wherein the comparison circuit comprises:
a third transistor, having a control terminal coupled to the input voltage, wherein a first terminal of the third transistor is coupled to the output voltage;
a fourth transistor, having a control terminal controlled by a first control signal, wherein a first terminal of the fourth transistor is coupled to a second terminal of the third transistor;
a current mirror, having a master current terminal coupled to a second terminal of the fourth transistor, wherein a slave current terminal of the current mirror is coupled to the output terminal of the comparison circuit;
a fifth transistor, having a control terminal controlled by the first control signal, wherein a first terminal of the fifth transistor is coupled to a reference voltage, and a second terminal of the fifth transistor is coupled to an enable terminal of the current mirror; and
a sixth transistor, having a control terminal coupled to the output terminal of the comparison circuit, wherein a first terminal of the sixth transistor is coupled to the system voltage, and a second terminal of the sixth transistor is coupled to the slave current terminal of the current mirror.

12. The output buffer as claimed in claim 11, wherein the comparison circuit further comprises:
a seventh transistor, having a control terminal controlled by a second control signal, wherein a first terminal of the seventh transistor is coupled to the system voltage, and a second terminal of the seventh transistor is coupled to the control terminal of the sixth transistor.

13. An operation method of an output buffer, comprising:
correspondingly generating a first gate control voltage and a second gate control voltage by an input stage circuit according to an input voltage of the output buffer;

correspondingly generating an output voltage of the output buffer by an output stage circuit according to the first gate control voltage and the second gate control voltage;

comparing the input voltage and the output voltage by a rising control circuit to obtain a first comparison result;

pulling down the first gate control voltage and the second gate control voltage by the rising control circuit during a first transient period when the first comparison result indicates that the output voltage is to be pulled up;

comparing the input voltage and the output voltage by a falling control circuit to obtain a second comparison result; and pulling up the first gate control voltage and the second gate control voltage by the falling control circuit during a second transient period when the second comparison result indicates that the output voltage is to be pulled down.

14. The operation method of the output buffer as claimed in claim 13, wherein the step of pulling down the first gate control voltage and the second gate control voltage comprises:

pulling down the first gate control voltage and the second gate control voltage by the rising control circuit when the input voltage is greater than the output voltage; and not to adjust the first gate control voltage and the second gate control voltage by the rising control circuit when the input voltage is smaller than or equal to the output voltage.

15. The operation method of the output buffer as claimed in claim 13, wherein the step of pulling up the first gate control voltage and the second gate control voltage comprises:

pulling up the first gate control voltage and the second gate control voltage by the falling control circuit when the input voltage is smaller than the output voltage; and not to adjust the first gate control voltage and the second gate control voltage by the falling control circuit when the input voltage is greater than or equal to the output voltage.

* * * * *